(12) United States Patent
Dodge et al.

(10) Patent No.: US 9,034,296 B2
(45) Date of Patent: May 19, 2015

(54) DIAMOND

(71) Applicants: Carlton Nigel Dodge, Isle of Man (GB); Raymond Anthony Spits, Isle of Man (GB)

(72) Inventors: Carlton Nigel Dodge, Isle of Man (GB); Raymond Anthony Spits, Isle of Man (GB)

(73) Assignee: Element Six Technologies Limited (GB)

( * ) Notice: Subject to any disclaimer, the term of this patent is extended or adjusted under 35 U.S.C. 154(b) by 0 days.

(21) Appl. No.: 14/019,663

(22) Filed: Sep. 6, 2013

(65) Prior Publication Data

US 2014/0020620 A1    Jan. 23, 2014

Related U.S. Application Data

(62) Division of application No. 12/529,183, filed as application No. PCT/IB2008/050851 on Mar. 7, 2008, now Pat. No. 8,574,535.

(60) Provisional application No. 60/894,920, filed on Mar. 15, 2007.

(30) Foreign Application Priority Data

Mar. 8, 2007 (GB) .................................. 0704516.4

(51) Int. Cl.
*B01J 3/06* (2006.01)
*C01B 31/06* (2006.01)
*B01J 3/08* (2006.01)
*C30B 25/18* (2006.01)

(52) U.S. Cl.
CPC ......... *C30B 25/18* (2013.01); *Y10T 428/24942* (2015.01); *Y10T 428/30* (2015.01); *B01J 3/062* (2013.01); *B01J 2203/061* (2013.01); *B01J 2203/062* (2013.01); *B01J 2203/0655* (2013.01); *B01J 2203/068* (2013.01)

(58) Field of Classification Search
None
See application file for complete search history.

(56) References Cited

U.S. PATENT DOCUMENTS

| | | | |
|---|---|---|---|
| 4,034,066 A | 7/1977 | Strong et al. | |
| 4,544,540 A * | 10/1985 | Tsuji | 423/446 |
| 4,836,881 A | 6/1989 | Satoh et al. | |
| 5,772,756 A | 6/1998 | Davies et al. | |
| 6,096,129 A | 8/2000 | Saito et al. | |
| 6,270,548 B1 | 8/2001 | Campbell et al. | |

(Continued)

FOREIGN PATENT DOCUMENTS

| | | |
|---|---|---|
| EP | 0 136 408 A1 | 4/1985 |
| EP | 0 290 044 A1 | 11/1988 |

(Continued)

OTHER PUBLICATIONS

Burns et al., "Growth of high purity large synthetic diamond crystals," Diamond and Related Materials 8, 1999, 1433-7.

(Continued)

*Primary Examiner* — Guinever Gregorio
(74) *Attorney, Agent, or Firm* — Bryan Cave LLP

(57) ABSTRACT

The present invention relates to an HPHT method for synthesizing single crystal diamond, wherein a single crystal diamond seed having an aspect ratio of at least 1.5 is utilized. Single crystal diamond seeds having an aspect ratio of at least 1.5 and synthetic single crystal diamond which may be obtained by the method recited are also described. The growth surface is substantially aligned along a <100> or <110> direction in the plane of the growth surface.

4 Claims, 7 Drawing Sheets

(56) References Cited

U.S. PATENT DOCUMENTS

| | | |
|---|---|---|
| 7,128,547 B2 | 10/2006 | Sung |
| 7,306,441 B2 | 12/2007 | Sung |
| 7,540,075 B2 | 6/2009 | Sung |
| 2005/0150444 A1 | 7/2005 | Sung |
| 2006/0231015 A1 | 10/2006 | Meguro et al. |
| 2006/0266279 A1 | 11/2006 | Mokuno |
| 2008/0067493 A1 | 3/2008 | Yamamoto et al. |
| 2011/0271900 A1 | 11/2011 | Spits et al. |

FOREIGN PATENT DOCUMENTS

| | | |
|---|---|---|
| EP | 0 589 464 A1 | 3/1994 |
| EP | 1 671 726 A1 | 6/2006 |
| JP | 03 217226 A | 9/1991 |
| WO | 93 22482 A1 | 11/1993 |
| WO | 2006 061707 A2 | 6/2006 |
| WO | 2007 066215 A2 | 6/2007 |
| WO | 2008107860 A1 | 9/2008 |

OTHER PUBLICATIONS

Glazer et al., "An automatic optical imaging system for birefringent media," Proc. R. Soc. Lond. A 452, 1996, 2751-65.

International Search Report for PCT/IB2008/050851 dated Aug. 13, 2008 (3 pages).

UK Search Report for GB 0704516.4 dated Jun. 4, 2007.

UK Search Report for GB 0704516.4 dated Aug. 22, 2007.

Nishibayashi et al., "Homoepitaxial growth on fine columns of single crystal diamond for a field emitter," Diamond & Related Materials, 9, 2000, pp. 290-294.

\* cited by examiner

DIAMOND

The present invention relates to a method for producing diamond material. In particular, the present invention relates to large single crystal diamonds and methods for producing the same using high pressure high temperature (HPHT) methods.

Synthesis of diamond by the temperature gradient HPHT method is well known in the art.

Conventional methods of diamond synthesis can produce single crystal diamonds of up to a few carats (about 6 mm largest lateral dimension) although some exceptionally large stones have been reported in R. C. Burns et al, Diamond and Related Materials, 8 (1999), 1433-1437, these are not routinely available due to the increased complexity in production.

For a range of products ranging from synthetic gem stones to substrates for homoepitaxial growth, maximising the fraction of the total volume of each crystal that can be used in a finished product is an important challenge in diamond synthesis. In addition, for many of these products there is a size requirement that makes it advantageous for cubic or octahedral shapes to be achieved for crystals above particular size thresholds.

Additionally, in some applications it is important for the diamond material in the finished product to have uniform optical properties. It is well known that the optical properties (for example optical absorption) of diamond may be strongly affected by its nitrogen content and that this is, in turn, sensitive to the growth sectors in the grown crystal. For instance, the solubility of single substitutional nitrogen in the {111} growth sector can be more than a factor of a hundred greater than in the {110} growth sector. Hence for some applications, including some mechanical ones, improved performance is offered by material consisting of one or predominantly one growth sector.

The morphology of HPHT synthesised diamond crystals can be controlled to a certain extent by varying the growth temperature. There is, however, a limit to the extent to which extremely cubic or extremely octahedral crystals can be produced using temperature alone to control the morphology.

In the growth of large diamond crystals by the reconstitution or temperature gradient method it is important to maintain the position of the seed crystals at the lower end of the temperature gradient. For this reason, the seeds from which diamond crystals are grown are generally retained in a ceramic carrier. The presence of the carrier means that crystals can generally only grow into half of the full solid angle, for example a roughly hemispherical volume around an equiaxed seed crystal. After growth the seed crystal remains exposed on the seed face of the as-synthesized large crystal. In addition the growing crystals typically have a "cubic" shape.

A crystal with a "cubic" shape has typically grown from the seed in three mutually perpendicular directions at approximately the same linear growth rate so that the end crystal is a facetted crystal that is approximately equiaxed when viewed normal to the seed face. The crystal is typically bounded by major facets of the type {100}, {110}, {111}, {113}, {115} and other minor facets. If either the {100} or the {100} and {110} facets are dominant, the crystal is described in the art as being "cubic"; if the {111} facets are dominant, the crystal is described in the art as being "octahedral"; if the {100}, {110} and {111} facets are all present and none is dominant, then the crystal is described in the art as being "cubo-octahedral". Which facets form during the growth process is a function of the precise conditions with the synthesis capsule.

There is an ongoing requirement for synthetic diamond plates with an edge length of 6 mm and greater for a variety of applications including the machining of acrylics, telescope mirrors, resin moulds and more recently the machining of LCD panel display units. In addition, profile cutters are used for a variety of applications from cutting precious metals to optical products. The main issue in supplying the market is the availability constraint and the quality. Generally, only a single long edge is required and many of these products have a large aspect ratio and are inefficiently cut from near equiaxed plates.

In order to produce suitably sized material, long synthesis cycle times are required with increased risk of hardware control failure and growth variation. In addition the number of seeds must be greatly reduced compared with the synthesis of smaller stones in order to provide adequate growth space. The combined effects of this result in relatively intensive use of industrial synthesis capacity and significantly reduced market availability.

A second issue with the growth of large diamonds is the control of crystal quality both in terms of shape, size variation and inclusion uptake: generally the larger the stone, the higher the probability that one or more of these quality issues will occur.

Research has focussed on alleviating these issues. One solution which has been investigated is the use of large seeds in the HPHT process. However, two problems have been encountered. The first is that where a large seed is used, multiple nucleation occurs and only a cluster of crystals is obtained instead of a single crystal with good quality. Second, due to the presence of metal atoms in the catalyst used in HPHT processes, metallic inclusions are observed in the material produced. Where a large seed was used, it was found that once the crystal had grown to a size of more than about 2 carats (yielding about a 4 mm edge length), inclusion incorporation was accelerated making it difficult to obtain a single crystal diamond of the desired quality.

In U.S. Pat. No. 4,836,881, the inventors sought to deal with these issues. A method is reported wherein diamond is synthesized from a large seed crystal having a diameter greater than 3 mm. Reference to a diameter is typically associated with the object being circular, cylindrical or spherical. However such shapes are unlikely for a diamond seed, and it must therefore be assumed that this term is used to refer to the fact that the seed is planar, having two major surfaces bounded by a number of side facets to form a prism that approximates to a circle. An example might be a seed with two (001) major surfaces, bounded by four {100} type planes and four {110} type planes, the side planes being of approximately equal size, and the seed, when viewed along the [001] direction being "equiaxed". The aspect ratio of the lateral dimensions of the seed would be approximately 1.

U.S. Pat. No. 4,836,881 teaches that in order to avoid excessive inclusion formation, it is necessary carefully to control the growth of the single crystal diamond by having a dissolution layer just above the seed which, during the early stages of the process, leads to the etching and subsequent removal of damage from the seed surface and by controlling the flux of carbon to the surface via tailoring the geometry and dimensions of the solvent slug.

Therefore, while U.S. Pat. No. 4,836,881 goes some way to solving the problems encountered when using large seeds, the solution presented is complicated and expensive.

In this regard, there is a need for a simple method by which it is possible to produce high quality single crystal diamond material which has large dimensions and which does not suffer from the problem of a high inclusion content.

The present invention provides a method for synthesizing single crystal diamond comprising:
- (a) selecting a single crystal diamond seed having a growth surface with two orthogonal dimensions a* and b*, where a* is the longest dimension of the growth surface substantially aligned along a <100> or <110> direction, in the plane of the growth surface, and b* is the longest dimension of the growth surface in a direction orthogonal to a* lying in the plane of the growth surface, where the aspect ratio of the growth surface which is defined as a*/b* is at least 1.5;
- (b) mounting the seed on or into a surface of a substrate such that the growth surface of the seed is exposed and the growth surface of the seed is substantially parallel to the surface of the substrate; and
- (c) effecting crystal growth in a high pressure high temperature environment under conditions such that a single crystal diamond is produced on at least the growth surface of the seed;

wherein the synthesized single crystal diamond has a longest dimension $a^\#$ aligned along a <100> or <110> direction, which exceeds at least 6 mm.

The present inventors have surprisingly found that by maximising the edge length while minimising the surface area of the growth surface of the single crystal diamond seed, it is possible to overcome the problems with the prior art, specifically by providing a simple method wherein large single crystal diamonds with a reduced metallic inclusion content can be produced.

A further advantage observed when using the method of the present invention is that for a given period of single crystal growth, a synthesized single crystal diamond with larger dimension is obtained as compared to the products obtained by use of methods disclosed in the prior art.

Advantageously, by using a seed crystal having a growth surface with an aspect ratio a*/b* of at least 1.5, it is possible to obtain single crystal diamond material having an as-synthesized morphology showing a high aspect ratio. The aspect ratio of the as synthesised diamond crystal is defined as $A^\#/B^\#$ wherein $A^\#$ and $B^\#$ define a notional surface $S^\#$ in the diamond parallel to either the {100} or the {110} plane which is substantially parallel to the seed face of the as-synthesized single crystal diamond material and $A^\#$ is the longest dimension of the as-synthesised single crystal diamond material within the surface $S^\#$ substantially aligned along a <100> or <110> direction, and $B^\#$ is the longest dimension of the as synthesised single crystal diamond orthogonal to $A^\#$ within the surface $S^\#$ substantially aligned along a <100> or <110> direction, wherein the largest dimension $a^\#$ is typically greater than previously possible. The notional surface $S^\#$ may be a real external surface or a conceptual internal surface, which latter surface may optionally be prepared as a real surface by subsequent processing.

In this regard, in a further aspect the present invention provides single crystal diamond material having an as-synthesized aspect ratio $A^\#/B^\#$ of at least about 1.5, wherein the longest dimension $a^\#$ of the as synthesized single crystal diamond material, substantially aligned along a <100> or <110> direction and parallel to the surface $S^\#$, is at least about 6 mm, and preferably the single crystal diamond comprises at least about 50% of a single growth sector by volume.

The term "seed face of the as synthesised diamond crystal material" as used herein refers to the face of the as synthesised single crystal diamond material which was in contact with a seed during growth.

A further advantage of the present invention is that it provides single crystal diamond material having an as-synthesized aspect ratio of at least about 1.5, wherein when the surface $S^\#$ is the as-synthesized external surface of the single crystal diamond material and $A^\#$ lies on this notional surface $S^\#$ such that $A^\#$ is $a^\#$, the longest dimension $a^\#$ is at least about 6 mm, and at least about 3 mm, preferably about 4 mm, preferably about 4.5 mm of this longest dimension on the surface $S^\#$ lies within a single growth sector. At least about 50%, preferably about 60%, preferably about 70%, preferably about 75% of the longest dimension $a^\#$ of the surface $S^\#$ comprises a single growth sector.

As the single crystal diamond material has a high aspect ratio, the amount of processing required after growth has been effected is minimised because the single crystal diamond has a shape and dimensions which are already suitable for a number of different applications. Thus time consuming cutting steps, which can result in wasting significant amounts of diamond material, are reduced.

Furthermore, it has surprisingly been found that when using a seed crystal with an aspect ratio of at least about 1.5, the single crystal diamond produced has a lower inclusion content. This is particularly advantageous where the single crystal diamond is to be used in applications where it provides a cutting edge and the exposure of metallic inclusions can result in degradation of the surface finish of a workpiece which is being cut.

A further advantage of the method of the present invention is that it makes it possible to obtain a single crystal product which comprises predominantly a single growth sector, particularly along a single cutting edge. This is advantageous as it improves the spatial homogeneity of defects while reducing the presence of {111} growth sectors which in turn reduces the number of extended defects present in the single crystal diamond produced.

The morphology of an as-synthesised stone can be described by its "crystal morphology index" or "CMI". This is a scale which had been used for several years in the present field. In essence, the CMI is the fractional cut back at each cube corner seen in plan made by the matching {111} planes on a scale of 0 to 8. A perfect cube (comprising 6 {100} facets) has a CMI of 0 and a perfect octahedron (comprising eight {111} facets) has a CMI of 8. A perfect cubo-octahedron (comprising six {100} facets and eight {111} facets) has a CMI of 4. Crystals which are bounded by a mixture of {100} and {111} type faces have CMI values that are greater than 0 and less than 8.

The derivation CMI is also described in the applicant's co-pending application ZA 2006/05663.

It has been demonstrated experimentally by the applicants that larger seeds result in the CMI of the synthesised diamonds being in a narrower band. Preferably the as synthesised diamond crystal has a CMI of less than about 3, preferably a CMI of less than about 2, preferably a CMI of less than about 1, preferably a CMI of less than about 0.5.

In a further aspect, the present invention provides a single crystal diamond seed having a growth surface with an aspect ratio of at least about 1.5.

The first step in the method of the present invention is the selection of a single crystal diamond seed having a growth surface with an aspect ratio of at least about 1.5.

As used herein, the term "longest dimension" refers to the maximum or largest dimension, fulfilling any additional conditions given such as crystallographic orientation.

Advantageously, the content of metallic inclusions has been found to be reduced where the growth surface of the single crystal diamond seed of the present invention has a dimension b* of less than about 2 mm, preferably less than about 1.5 mm, preferably less than about 1 mm, more preferably less than about 0.5 mm. Without wishing to be bound by any particular theory, it is believed that this is as a consequence of reducing the probability of multiple nucleation occurring.

The seed is a single crystal diamond, preferably a synthetic single crystal diamond. The synthetic single crystal diamond seed can be either a high pressure-high temperature (HPHT) diamond or a chemical vapour deposition (CVD) diamond, but is preferably a HPHT diamond. Where an HPHT diamond is used, it may be a type Ib or type IIa or type IIb synthetic diamond, but is preferably a type Ib synthetic diamond.

The term "growth surface" is used throughout the specification to describe the surface of the seed upon which growth will be effected, and thus upon which new material will be grown, in the method of the present invention. Typically, the growth surface of the seed will be approximately parallel to a surface of the substrate onto which it is generally mounted and is the surface presented to the solvent catalyst and carbon growth species present in HPHT processes. Growth will occur away from the growth surface of the seed in all directions above the surface of the substrate, although the rate of growth in a particular direction will be dependent upon the growth sector of the growth and the growth conditions. Advantageously the growth surface will be a major face of the seed although this is not a requirement of the present invention.

While the character of the growth surface of the seed is not limited, preferably a single crystal diamond seed is selected which has a growth surface close to the {100} face. This may be preferred where it is desirable that the single crystal diamond material produced has an as-grown {100} face, which is particularly advantageous where the single crystal diamond material produced is to be used as a substrate for chemical vapour deposition (CVD) growth. In this regard, preferably, the single crystal diamond seed has a growth surface the normal of which is within approximately 15° of a <100> direction. More preferably the single crystal diamond seed has a growth surface the normal of which is within approximately 10° of a <100> direction. More preferably the single crystal diamond seed has a growth surface the normal of which is within approximately 5° of a <100> direction.

In this case, preferably the edges of the (001) growth surface are close to either <100> or <110> directions. Where the edges of the (001) growth surface are close to <110> directions, advantageously the single crystal diamond material produced is particularly suitable for applications where a hard wearing cutting edge is required. In this regard, preferably the edges of the {100} growth surface are within approximately 15° of either <100> or <110> directions. Preferably the edges of the {100} growth surface are within approximately 10° of either <100> or <110> directions. Preferably the edges of the {100} growth surface are within approximately 5° of either <100> or <110> directions. Preferably, the side facets of the single crystal diamond seed are within approximately 15° of being perpendicular to the growth surface. Preferably, the side facets of the single crystal diamond seed are within approximately 10° of being perpendicular to the growth surface.

Alternatively, it may be preferred that the single crystal diamond seed selected has a growth surface close to a {110} face. This may be preferred where it is desirable that the single crystal diamond to be produced has as-grown {100} and {110} faces. In this regard, preferably the single crystal diamond seed has a growth surface the normal of which is within approximately 15° of a <110> direction. More preferably the single crystal diamond seed has a growth surface the normal of which is within approximately 10° of a <110> direction. More preferably the single crystal diamond seed has a growth surface the normal of which is within approximately 5° of a <110> direction. The edges of the growth surface are with 15° of either <100> or <110> directions or a mixture of <100> and <110> directions. The side facets of the single crystal diamond seed are within approximately 15° of being perpendicular to the growth surface.

Preferably the normal to the growth surface of the seed lies within approximately 15° of a <100> direction or a <110> direction, more preferably within approximately 15° of a <100> direction.

The "aspect ratio" of the growth surface of the single crystal diamond seed is an important aspect of the present invention. As used herein, the term "aspect ratio" refers to the ratio a*/b* of the longest or maximum length or dimension of the growth surface of the seed, a*, substantially aligned along a <100> or <110> direction, in the plane of the growth surface, to the orthogonal or perpendicular direction lying in the plane of the growth surface, b*. The term "substantially aligned" as used herein requires that the dimension is within approximately 20°, preferably within approximately 10°, preferably within approximately 5° of being parallel to the direction to which reference is made.

The edge length of the growth surface of the seed is maximised, and the surface area of the growth surface of the seed is minimised, by choosing a seed with a high aspect ratio. The maximisation of the edge length provides the desirable object of a synthetic single crystal diamond suitable for use, for example, as a single point turning tool. The minimisation of the surface area substantially reduces, or even eliminates, the problems of multiple nucleation and inclusion incorporation that are commonly encountered problems associated with the use of large substrates, as reported in the prior art and described above. This is particularly the case where the growth surface of the single crystal diamond seed has a dimension b* which is particularly small as detailed above.

The shape of the growth face of the seed is not limited. However, typically and preferably, the growth face of the seed is rectangular with edges substantially aligned along the <100> or <110>, in which case b* is the shortest dimension of the growth face of the seed. Seeds can be used with truncated corners, or other features which mean the seed growth face is not a perfect rectangle. Preferably there are no truncated corners. Further discussion shall focus on rectangular seeds for simplicity but this does not reduce the generality of the invention.

For a rectangular seed having a longest edge length, d, and an aspect ratio, r, the area of the growth surface, A, is given by:

$$A = d^2/r$$

The area is thus 1/r times the area of a square seed with the same longest edge length. Since the probability of multiple nucleation has been found experimentally by the inventors to be related to the area, and experiments by the inventors suggest that it is proportional to the area raised to a power greater than 1, then minimising the area of the seed yields improvements to the quality of the synthesised stone by reducing the probability of multiple nucleation and inclusion of metallic solvent at the critical early stages of growth on the seed whilst maintaining the ability to produce the desired long edge lengths.

In a further aspect, the present invention relates to the use of a single crystal diamond seed crystal having an aspect ratio of at least about 1.5 in a high pressure high temperature method for synthesizing diamond.

The growth surface of the single crystal diamond seed has an aspect ratio, a*/b*, of at least about 1.5, preferably at least about 2, preferably at least about 2.5, preferably at least about 3, preferably at least about 4, preferably at least about 5, preferably at least about 10.

It is furthermore desirable that the growth surface of the single crystal diamond seed has a large longest dimension a*, where a* is the longest dimension of the growth surface substantially aligned along a <100> or <110> direction. Preferably, the growth surface of the single crystal diamond seed has a dimension a* of at least about 3 mm, preferably at least about 3.5 mm, preferably at least about 4 mm, preferably at least about 5 mm, preferably at least about 6 mm, preferably at least about 8 mm, preferably at least about 10 mm.

If the aspect ratio of the seed is too large, non-hydrostatic stresses imposed on the seed, particularly during the ramp to synthesis temperature and pressure, can result in the seed either bending or cracking or both. This effect can partially be alleviated by increasing the depth of the seed (that is, the dimension of the seed in a direction perpendicular to the surface intended to be the growth surface during synthesis). Even so there is a practical upper limit to the aspect ratio of the growth surface. The aspect ratio of the growth surface is preferably less than about 30, preferably less than about 20.

As defects tend to propagate from the seed through to the material grown on the seed, it is preferred that the seed selected contains a minimum number of defects. More specifically, it is preferred that, when viewed using an optical microscope at a total magnification of ×10, the surface which will be the growth surface of the seed has an average count of surface defects due to inclusions that is less than about 300 per $mm^2$, preferably less than about 100 per $mm^2$, preferably less than about 80 per $mm^2$, preferably less than about 60 per $mm^2$, preferably less than about 30 per $mm^2$, preferably less than about 10 per $mm^2$, preferably less than about 5 per $mm^2$, preferably less than about 2 per $mm^2$, preferably less than about 1 per $mm^2$, preferably zero per $mm^2$.

Advantageously, the single crystal diamond seed is selected is such that at least about 30%, more preferably at least about 50%, more preferably at least about 75%, more preferably at least about 80%, more preferably at least about 85%, more preferably at least about 90%, more preferably at least about 95% of the area of the surface of the seed that will become the growth surface when synthesis starts is a single growth sector. Preferably the single growth sector is a {100} growth sector. This is advantageous because it means that the single crystal diamond grown on the seed will contain fewer extended defects, since these typically propagate from regions of high strain in the seed and in particular from regions adjacent to growth sector boundaries in the seed.

Advantageously, the single crystal diamond seed selected has a low level of strain. This is advantageous because it reduces the probability of multiple nucleation occurring and thus reduces the content of metallic inclusions in the single crystal diamond material produced by growth on the seed. Strain in diamond is most easily evaluated using polarised light microscopy or similar techniques (for example, using an instrument such as "Metripol" which enables the optical retardation of the crystal to be determined over large areas). Since a perfect strain-free diamond is cubic, it is black when viewed in transmission between a pair of crossed polars. The addition of a non-homogeneous strain results in the cubic symmetry of the crystal being lost and the sample becoming birefringent. The level of birefringence can be quantified. The level of birefringence recorded is also related to the number of metallic inclusions present in the material. The greater the content of metallic inclusions, the higher the birefringence recorded. Thus a low birefringence level is indicative of low inclusion content.

Preferably the seed has a birefringence over at least about 50% of the area of the growth surface of the seed, more preferably at least about 60% of the area of the growth surface of the seed, more preferably at least about 70% of the area of the growth surface of the seed, more preferably at least about 80% of the area of the growth surface of the seed, that is less than about $5\times10^{-3}$, more preferably less than about $1\times10^{-3}$, more preferably less than about $5\times10^{-4}$, more preferably less than about $1\times10^{-4}$, wherein the direction of view is normal to the growth surface of the seed.

The single crystal diamond seed which is selected in step (a) of the method of the present invention may be used in its as-grown state. Alternatively, the seed may be subjected to processing steps prior to its use in the method of the present invention. Where such steps are included, an improvement in the quality of the surface and edges of the seed may be obtained. For example, one or more steps may be included to reduce edge chipping.

Preferably the edges of the single crystal diamond seed which is selected in step (a) of the method has low edge chipping. More specifically, it is preferred that, when viewed using an optical microscope at a total magnification of ×10, the edges of the growth surface of the seed have an average count of visible edge chips or defects that is less than about 30 per mm, preferably less than about 10 per mm, preferably less than about 5 per mm, preferably less than about 3 per mm, preferably less than about 2 per mm, preferably less than about 1 per mm, preferably zero per mm.

Preferably the single crystal diamond seed which is selected in step (a) of the method of the invention is free of cracks when viewed using an optical microscope at a total magnification of ×10.

Preferably the single crystal diamond seed which is selected in step (a) of the method of the invention is not twinned.

If the seed is to be processed prior to its use in the method of the present invention, the processing steps may include one or more of the following: scaif polishing and other mechanical processing steps such as lapping, plasma processing, reactive ion etching, high pressure-high temperature annealing (at temperatures of up to 2500° C.), high temperature annealing under high vacuum conditions (that is at a pressure of less than about $10^{-4}$ mbar), high temperature annealing under a protective, non-oxidising atmosphere (for example argon or 1% hydrogen-in-argon).

Preferably the single crystal diamond seed of the present invention has a surface roughness, $R_a$ of less than about 100 nm, preferably less than about 80 nm, preferably less than about 60 nm, preferably less than about 50 nm, preferably less than about 30 nm, preferably less than about 20 nm, preferably less than about 10 nm. If necessary, such a surface roughness can be achieved by polishing the seed.

In one embodiment, the present invention provides a single crystal diamond seed having a growth surface with two orthogonal dimensions a* and b*, where a* is the longest dimension of the growth surface substantially aligned along a <100> or <110> direction in the plane of the growth surface, and b* is the longest dimension of the growth surface in a direction orthogonal to a* lying in the plane of the growth surface, where the aspect ratio of the growth surface which is defined as a*/b* is at least 1.5 preferably at least about 2, preferably at least about 2.5, preferably at least about 3, preferably at least about 4, preferably at least about 5, preferably at least about 10, wherein at least about 30%, more preferably at least about 50%, more preferably at least about 75%, more preferably at least about 80%, more preferably at least about 85%, more preferably at least about 90%, more preferably at least about 95% of the area of the surface of the seed that will become the growth surface when synthesis starts is a single growth sector and wherein the growth surface of the single crystal diamond seed of the present invention has a dimension b* of less than about 2 mm, preferably less than about 1.5 mm, preferably less than about 1 mm, more preferably less than about 0.5 mm.

After selecting the seed, the method of the present invention may include an additional step of cleaning the seed. A hot oxidising acid mixture such as, for example, a mixture of concentrated sulphuric acid and potassium nitrate at a temperature in excess of about 150° C. may be used in this step, where it is included.

The method of the present invention comprises a second step (b), after step (a) and before step (c), of mounting the seed on or into a surface of a substrate such that the growth surface of the seed is exposed and the growth surface of the seed is substantially parallel to the surface of the substrate.

In high pressure high temperature (HPHT) synthesis of single crystal diamond material, the substrate is generally a seed pad into which the seeds are pressed in a way such that the face which will form the growth surface of the seed lies roughly in the plane of the surface of the seed pad. The present inventors have found that in order to produce HPHT-grown diamond material that is of high crystalline quality, it is advantageous to use a seed which has a growth surface that has a crystallographic orientation such that, in subsequent growth, extended defects (such as dislocations and stacking faults) do not propagate normal to that growth surface. Where this condition is met any extended defects that either nucleate at the seed surface or thread though from within the seed will propagate away from the central region of the subsequently grown material, leaving it relatively free of extended defects. Preferably the growth surface of the seed is thus oriented within approximately 15° of a {100} or {110} plane, more preferably within approximately 15° of a {100} plane.

In this step, the substrate on to which the seed is mounted may be made from any material commonly used to produce substrates in the field of HPHT synthesis. For example, the substrate may be made from a ceramic material such as an aluminium silicate, aluminium oxides, zirconium oxide or magnesium oxide. Further suitable materials include salts.

In order to improve the efficiency of the method of the present invention, it may be preferable to mount more than one single crystal diamond seed on the substrate thus enabling the simultaneous growth of a number of single crystal diamonds.

Where more than one seed is mounted on the substrate, there are many ways in which the seeds can be oriented on the substrate. It is preferred that the seeds are arranged in a regular array as this is more reproducible. Examples of possible arrangements of seed are shown in FIGS. 1(a) to (f). The seeds can be arranged in linear rows, which may or may not be staggered relative to other rows, or radially or in an arrangement which is a combination of radial and linear rows. A preferred arrangement is to use an arrangement of staggered rows as illustrated in FIG. 1(b).

The spacing of the seeds is preferably such that the distance between two adjacent seeds in the same row is within about 25% of the spacing between adjacent rows of seeds. The absolute value of the spacing is determined by the size of the seeds and the desired final size of the stones. It will be appreciated that the stones after they have grown should not impinge upon one another. It is also important that the growing stones do not get too close as this can affect the carbon flux to the sides of the stones and result in the shape becoming irregular to an undesirable extent.

If the initial seeds have dimensions a*×b* and are separated from adjacent seeds by a distance d and the final stones are to have dimensions A×B (where the directions in which A and B are measured are the same direction as a* and b* respectively) and have to be separated by a distance at least equal to D to ensure good growth, then $$d \geq D - (A - a^*)$$

and $$d \geq D - (B - b^*)$$

Step (c) of the method of the present invention comprises effecting crystal growth in a high pressure high temperature (HPHT) environment under conditions such that a single crystal diamond is produced.

Generally in an HPHT process, the substrate onto which the seed is mounted is assembled into a synthesis capsule with a carbon source, preferably high purity graphite or diamond, and a solvent-catalyst metal alloy. Where diamond is used as the carbon source, it is generally finely crushed diamond. The use of diamond as the carbon source is associated with several advantages. First, where graphite is used as a carbon source, there is a significant change in volume during the HPHT process. In contrast, this is avoided by the use of diamond as the carbon source where there is no net change in volume during the HPHT process. Second, the impurities of the synthesized single crystal diamond material are reduced where diamond is used as the carbon source.

Those skilled in the art will be aware that the exact arrangement of the seed pad, carbon source and solvent catalyst will be specific to the particular high pressure-high temperature apparatus that is being used.

The solvent-catalyst may be any known in the art, but preferably comprises manganese, cobalt, iron and nickel. Alloys predominantly comprising two or more of cobalt, nickel and iron may also be used. More preferably, the solvent-catalyst is an iron-nickel alloy. Preferably the solvent-catalyst components are prepared, purified and pre-alloyed by methods known to those skilled in the art so as to ensure growth of diamond crystals of adequate clarity, particularly in the sense of elimination of metal inclusions.

The HPHT process of step (c) is carried out under conditions such that a single crystal diamond is produced which preferably has a face in a plane substantially parallel to the growth surface of the seed crystal with a longest dimension of at least about 6 mm. The HPHT method may either be temperature driven or by means of reconstitution (also known in the art as the "reconstitution method"). Advantageously, the HPHT process is carried out at pressures of from about 5 to about 6 GPa and at temperatures from about 1260° C. to about 1600° C., but more preferably from about 1280° C. to about 1330° C., with appropriate systems for the stabilisation of pressure and temperature during the process. The time of growth may extend from a few tens of hours to a few hundreds of hours depending upon the size of crystal desired, but is typically in the range about 50 to about 200 hours.

It will be appreciated by those skilled in the art that the exact operating conditions are dependent upon the type of diamond to be synthesised. For example, whilst the above conditions are suitable for the synthesis of type Ib diamond, the process windows for the synthesis of type IIa and IIb diamonds are likely to different, both in terms of the location of the window and the size of the window.

After completion of crystal growth in step (c) of the method of the present invention, the synthesized single crystal diamond can generally be simply broken off the substrate. Alternatively, the method of the present invention may optionally include, after step (c) an optional step of separating the single crystal diamond from the substrate.

The method of the present invention may also include an optional step, after step (c) of removing residual solvent-catalyst. This may be effected by, for example, dissolution in hot aqua regia or by any other technique known in the art.

The present invention further provides synthetic single crystal diamond material having an as-synthesized aspect ratio, $A^\#/B^\#$ of at least about 1.5, wherein the longest dimension the single crystal diamond material is at least about 6 mm. Preferably the single crystal diamond comprises at least about 50% of a single growth sector by volume.

Preferably the synthesised single crystal has a major face substantially parallel to the growth surface of the seed which has a longest dimension substantially aligned along a <100> or <110> direction in the plane of the major face, which exceeds at least about 6 mm.

In a further aspect, the present invention provides synthetic single crystal diamond material having major faces and an as-synthesized aspect ratio, $A^\#/B^\#$, of at least about 1.5, wherein the longest dimension of an edge of a major face is at least about 6 mm and the longest edge contains at least about 3 mm of a single growth sector. Preferably the longest edge contains at least about 3 mm of a single growth sector, preferably contains at least about 3.6 mm of a single growth sector, preferably contains at least about 4.2 mm of a single growth sector, preferably contains at least about 4.5 mm of a single growth sector. Preferably the longest edge contains at least about 50% of a single growth sector, preferably contains at least about 60% of a single growth sector, preferably contains at least about 70% of a single growth sector, preferably contains at least about 75% of a single growth sector. Preferably the major face is substantially parallel to the seed growth face.

The synthetic single crystal diamond material of the present invention has been produced by an HPHT method. As a consequence of the synthesis by an HPHT method, the single crystal diamond material of the present invention typically comprises at least about 5 ppm, preferably at least about 10 ppm, preferably at least about 20 ppm, preferably at least about 50 ppm, preferably at least about 100 ppm, preferably at least about 250 ppm, preferably at least about 500 ppm of nitrogen measured either by Fourier transform infrared spectroscopy (FTIR spectroscopy) or by secondary ion mass spectroscopy (SIMS). This means that it will have a yellow colour.

Synthetic diamond produced by HPHT methods has unique features that can be identified by photoluminescence (PL) spectroscopy. These are related to the incorporation of individual metal atoms from the solvent catalyst metal into the lattice of the diamond. Such unique features are observed in the material of the present invention.

For example it is reported in the literature that under 325 nm excitation, PL features thought to be associated with Co are observed at 523.8, 544.5, 561.7, 580.7 nm. With excitation at 632.8 nm, further peaks at 657.7, 669.2, 720.8, 722.8, 793.2, 807.6, 863.9, 868.8, 882.6, 884.7, 887.4 and 992.3 nm are also thought to be associated with Co.

Excitation at 632.8 nm of diamond synthesised using a nickel-containing solvent catalyst show nickel-related features at 657.7, 722.8, 793.2, 807.6, 868.8, 882.6 and 884.7 nm. Further nickel-related features are observed under 532 nm excitation at 728, 707, 751 nm. There is a feature believed to be due to $Ni^+$ in an interstitial site at 881 nm. The FTIR spectra of HPHT synthetic diamonds can have absorption features at 1332 $cm^{-1}$ due to $N^+$ (ionised single substitutional nitrogen); this is believed to be formed by charge-transfer between Ni and N yielding $N^+$ and $Ni^-$. As there is a correlation between the two, the absorption coefficient at 1332 $cm^{-1}$ can be used to determine the concentration of $Ni^-$. In some prior art it has been reported that the local Ni concentration is greater than 100 ppm in certain stones.

Advantageously, the single crystal diamond material of the invention has a surprisingly low inclusion content. HPHT processes always involve the use of a catalyst which comprises metal atoms and additionally, it is often the case that the substrate into which the seed is mounted includes a metallic component. As a consequence, it is therefore almost inevitable that during the growth of the single crystal diamond, small pieces of the solvent catalyst are included in the growing diamond generating "inclusions".

There are several different types of inclusion which may be present in HPHT-synthesized diamond material. The first type is present in the vicinity of the interface between the seed and the synthesized single crystal. The second and third types of inclusion are "cloud" and "rod" inclusions respectively. These are generally found deeper within the synthesized diamond, often within {111} growth sectors or along or close to the boundaries between growth sectors (for example along the boundaries between {100} and {110} growth sectors).

The present invention is particularly concerned with reducing the content of inclusions of the first type and it is believed that by reducing the amount of {111} growth sector and the amount of growth sector boundary in the growing stone, the content of cloud and rod inclusions is also reduced.

The presence of inclusions is particularly a problem where the single crystal diamond is to be used for cutting applications. This is because, as the diamond is used in such applications, the surface will wear potentially revealing any metal inclusions located in the vicinity of the cutting surface of the diamond. If an inclusion is revealed at the cutting surface then it is likely that the surface which is being cut will be damaged. Accordingly, it is advantageous to minimise the number of inclusions present and thus reduce the probability that an inclusion will be revealed during a cutting operation.

Inclusion content can be assessed in many ways. For example the catalyst metals are typically transition metal and therefore are magnetic to at least some extent, so a method that measured the magnetic susceptibility of the diamond could be used as a measure of the number of inclusions. However the preferred method is an optical method. The upper major surface of the stone is given a "cosmetic polish" such that its interior can be viewed. The stone is viewed with transmitted light under a stereo microscope (for example a Zeiss DV4) at a magnification of 10×. At this magnification, inclusions with a size greater than about 30 μm are visible, often as black spots, within the diamond. Using about 1 mm×1 mm grid on a graticule within the one of the microscope's eyepieces, all the inclusions within the about 1×1 mm area are counted. The number of about 1×1 mm areas where the inclusions are counted is at least five and cover an area of at least about 20% of the area of the upper surface of the stone. The arithmetical mean of the at least five inclusion counts is calculated at the number divided by the thickness of the stone in mm to give average inclusion content per $mm^2$ of top surface per mm of thickness, that is per $mm^3$.

The average inclusion content measured by the above method is less than about 1000 per $mm^3$, preferably less than about 500 per $mm^3$, preferably less than about 200 per $mm^3$, preferably less than about 100 per $mm^3$, preferably less than about 50 per $mm^3$, preferably less than about 20 per $mm^3$, preferably less than about 10 per $mm^3$, preferably less than about 5 per $mm^3$, preferably less than about 2 per $mm^3$.

An alternative is to examine the birefringence of the single crystal diamond material as this will be affected by the content of inclusions since local lattice strain is often present. In this regard, a high birefringence level is indicative of a high content of inclusions. Further details of the measurement of birefringence are provided below.

Advantageously, the single crystal diamond material of the present invention has an external morphology that is predominantly cubic, that is to say that at least about 50%, preferably at least about 60%, preferably at least about 70%, preferably at least about 75%, of the surface area of the as-grown stone comprises {100}-type planes. The remainder of the surface comprises a mixture of {110}-, {111}-, {113}- and {115}-type planes. It is preferred that of the area that is not {100}-type planes, the proportion that is not either {110} or {111} is less than about 20%, preferably less than about 15%, preferably less than about 10% of the surface area. By producing single crystal diamond which has an external morphology which is predominantly cubic, the number of steps required to process the diamond material into a form in which it can be used in the application of interest are minimised.

The single crystal diamond material of the present invention has an as-synthesized aspect ratio of at least about 1.5, preferably at least about 2, preferably at least about 2.5, preferably at least about 3, preferably at least about 4, preferably at least about 5, preferably at least about 10. The term "as-synthesized aspect ratio" is used to refer to the aspect ratio, $A^\#/B^\#$, wherein $A^\#$ and $B^\#$ define a notional surface $S^\#$ in the single crystal diamond material substantially parallel to either the {100} or the {110} plane which is substantially parallel to the seed face of the as-synthesized single crystal diamond material and $A^\#$ is the longest dimension of the as-synthesized single crystal diamond material within the surface $S^\#$ substantially aligned along a <100> or <110> direction, and $B^\#$ is the longest dimension of the as-synthesized single crystal diamond material orthogonal to $A^\#$ within the surface $S^\#$, substantially aligned along a <100> or <110> direction The notional surface $S^\#$ may be a real external surface or a conceptual internal surface.

The term "substantially parallel" as used herein requires that the direction or plane is within approximately 20°, preferably within approximately 10°, preferably within approximately 5° of being parallel to the direction or plane to which reference is made.

The term "substantially perpendicular" as used herein requires that the direction or plane is within approximately 20°, preferably with approximately 10°, preferably within approximately 5° of being perpendicular to the direction or plane to which reference is made.

The terminology "as-synthesized" requires that the single crystal diamond material has this aspect ratio as-grown and no further processing steps are required in order to obtain the recited aspect ratio.

The synthesised single crystal diamond material of the present invention has a longest dimension $a^\#$ substantially aligned along a <100> or <110> direction and substantially parallel to the surface $S^\#$, that is at least about 6 mm, preferably at least about 7 mm, preferably about at least 8 mm, preferably at least about 9 mm, preferably at least about 10 mm, preferably at least about 11 mm, preferably at least about 12 mm. Preferably this longest dimension lies on the notional surface $S^\#$ such that $A^\#$ is $a^\#$ and $B^\#$ is the longest dimension of the diamond material orthogonal to $a^\#$. Preferably this longest dimension lies parallel to a major face, and more preferably lies in a major face. The term "major face" as used herein refers to the face of the material having the largest surface area. The major face(s) of the material will generally be in a plane which includes the longest dimension and is substantially parallel to the growth surface of the seed on which the diamond has been synthesized.

Single crystal diamonds which have such dimensions are particularly desirable for cutting applications.

The single crystal diamond material of the present invention is further characterised by comprising one dominant growth sector. Advantageously, where the longest dimension of the as-synthesised single crystal diamond material lies on the notional surface $S^\#$, the surface $S^\#$ touches an as-synthesized external surface of the single crystal diamond material, which is substantially parallel to the seed face, at at least one point and preferably the longest dimension $a^\#$ contains at least about 3 mm, preferably at least about 4 mm, preferably at least about 5 mm, preferably at least about 6 mm, preferably at least about 8 mm of a single growth sector. Advantageously, at least about 50%, preferably at least about 60%, preferably at least about 70%, preferably at least about 75%, preferably at least about 80%, of length of the longest dimension of the as-synthesised diamond comprises a single growth sector.

In some circumstances the key dimension is the longest dimension within a single growth sector, even if this dimension does not lie along the longest dimension of the as-synthesised diamond. Advantageously, the longest dimension aligned along a <100> or <110> direction lying wholly within a single growth sector exceeds at least about 5 mm, preferably at least about 6 mm, preferably at least about 8 mm, preferably at least about 10 mm, preferably at least about 12 mm.

It is preferred that if the seed crystal used in the growth of the single crystal diamond material had a {100} growth surface, then the dominant growth sector is the {100} growth sector or if the seed crystal had a {110} growth surface, then the dominant growth sector is the {110} growth sector.

The proportion of the preferred growth sector can be determined by, for example, using an ultraviolet luminescence microscope such as a DiamondView™ instrument. Different growth sectors incorporate nitrogen-related defects at different rates when exposed to essentially the same growth environment and consequently the intensity of luminescence due to nitrogen-related defects differs between growth sectors. Therefore the different growth sectors can be identified in the luminescence image. The proportion of the dominant growth sector is determined from the luminescence image obtained by viewing approximately (that is, within about 20°) along the normal to the growth surface and comparing the area of the growth sector in the image with the total area of the stone in the image.

The as synthesised single crystal diamond of the present invention comprises at least about 50%, preferably at least about 60%, preferably at least about 70%, preferably at least about 80%, preferably at least about 85%, preferably at least about 90%, preferably at least about 95%, preferably at least about 98%, of a single growth sector by volume.

Product prepared from the as synthesised single crystal diamond of the present invention preferably comprises at least about 60%, preferably at least about 70%, preferably at least about 80%, preferably at least about 85%, preferably at least about 90%, preferably at least about 95%, preferably at least about 98%, of a single growth sector by volume.

Advantageously, the single crystal diamond material of the present invention preferably has a low extended defect density, particularly where the predominant growth sector is the {100} growth sector. In HPHT synthesis, dislocations and stacking faults, that is extended defects, tend to grow in the {110} and {111} growth sectors respectively, rather than the {100} growth sectors. Methods of counting and characterising extended defects (stacking faults and dislocations) are disclosed in the applicant's co-pending application PCT/IB2006/003531.

More specifically, the extended defect density can be characterised by X-ray topography, carried out under conditions where either the Burgers vector of individual extended defects can be determined or where individual extended defects can be distinguished, such as, for example, using a 0.25 mm slit width, on Ilford L4 nuclear emulsion using Mo K$\alpha_1$ radiation (of wavelength 0.070926 nm) from a Marconi GX20 rotating anode X-ray generator. This measurement is made using a topograph of an appropriate reflection. Examples of reflections which may be appropriate for making this measurement include the {533} and {111}.

For more detailed investigation of the extended defect content of diamond samples, x-ray projection topography can be carried out. This gives more complete information on the dislocation content throughout the complete volume of a sample. This information includes the spatial distribution of the dislocations and their line direction. By comparison of the contrast caused by individual dislocations in topographs generated using different X-ray reflections it is also possible to characterize dislocations in terms of the their Burgers vectors. For Burgers vector analysis of dislocations within a sample, X-ray projection topographs were recorded for each of the four different <111> reflections. Dislocations in diamond generally have Burgers vectors along <110> directions. The six different <110> directions are given by the lines along which two different kinds of {111} planes intersect. To a good approximation, dislocations are invisible in a given topograph if their Burgers vector lies parallel to the atomic planes that are diffracting the X-rays. This means that for a set of four topographs, each generated using a different <111> reflection, a given dislocation should be present in two topographs but absent from the other two topographs, with the Burgers vector given by the line of intersection of the diffracting planes for the two topographs for which the dislocations are absent.

Stacking faults in a diamond crystal lie in {111} planes and give rise to a distortion of {111} atomic planes of the crystal. By recording x-ray projection topographs for each of the four {111} reflections we can therefore be sure that the results will show contrast from all stacking faults in the crystal.

Using {111} diffraction had the following additional advantages in this work. It is a strong reflection and allows four equivalent views of parallel-sided (001) plate samples, recorded using the four different {111} reflections. With Mo K$\alpha_1$ radiation, it gives a near plan view which allows individual threading dislocations to be observed in a direction close to their line direction.

Typically the dislocation density measured using {111} projection x-ray topography is less than about 500 per mm². Typically the preferred {100} growth sector has a length of line segment of stacking fault determined using {111} projection x-ray topography that is less than about $10^4$ mm per mm³.

By nature of the open lattice and the relative energy differences between twinned and untwinned surfaces, the {111} growth sector is characterised by high point defect density and also a higher extended defect density. Therefore significant {111} growth sectors are not preferred, and {100} growth sectors are preferred over {110} growth sectors.

As used herein, a "point defect" in diamond is an atom or group of atoms other than hydrogen or carbon, or an isolated vacancy on either a lattice site or a non-lattice site. Point defects that result from intentional additions of species to the growth environment may also be referred to as "dopants" or "dopant atoms". Point defects that result from unintentional additions of species to the growth environment may also be referred to as "impurities" or "impurity atoms". Point defects where the atom is on a lattice site may also be referred to as "substitutional defects" or "substitutional atoms" or "substitutional impurities". Point defects where the atom is on a non-lattice site may also be referred to as "interstitial defects" or "interstitial atoms" or "interstitial impurities".

The term "extended defect density" is used to refer to stacking faults and/or dislocations. Where the stacking fault does not intersect a surface, then its boundary is defined by a single dislocation loop. Where the stacking fault intersects a surface, this dislocation loop is broken.

These extended defects, by nature of the distortion that they put into the lattice can also, in some cases, be imaged using birefringence.

For an isotropic medium, such as stress-free diamond, the refractive index is independent of the direction of the polarization of incident light. If a diamond sample is inhomogeneously stressed, either because of grown-in stress or local defects or because of externally applied pressure, the refractive index is anisotropic (that is the material can become optically anisotropic). The variation of the refractive index with direction of polarization may be represented by a surface called the optical indicatrix that has the general form of an ellipsoid. The difference between any two ellipsoid axes is the linear birefringence for light directed along the third. This may be expressed as a function involving the refractive index of the unstressed material, the stress and opto-elastic coefficients of the material.

It is possible to measure birefringence of a material in a number of ways. For example, birefringence may be measured using the conventional technique of polarimetry LP-S-LA (linear polariser-specimen-linear analyser) in which polarisers and compensating optical elements are inserted into the light path, but the resolution of such techniques is relatively low.

A more sophisticated technique with considerably higher resolution, RLP-S-CA (rotating linear polariser-specimen-circular analyser), has been developed in which the sample is illuminated in transmission with linearly polarised light (preferably monochromatic) the plane of polarisation of which is rotated. After passing through an anisotropic sample, the light is analysed with a circular analyser consisting of a polariser and a quarter-wave-plate. A CCD camera is used to image the sample, the digital output of which can be subjected to further processing. RLP-S-CA has been implemented as a commercial system, "Metripol" (Oxford Cryosystems) and disclosed in GB2310925. RLP-S-CA, and the "Metripol", gives information on how the refractive index at a given wavelength depends on polarization direction in the plane perpendicular to the viewing direction. An explanation of RLP-S-CA and how "Metripol" in particular works is given in A. M. Glazer et al. in Proc. R. Soc. Lond. A (1996) 452, 2751-2765.

The RLP-S-CA method as used in "Metripol" determines the direction of the "slow axis", i.e. the polarization direction in the plane perpendicular to the viewing direction for which the refractive index is a maximum. It also measures |sin δ| where δ is the phase shift given by:

$$\delta = (2\pi/\lambda)\Delta nL$$

where λ is the wavelength of the light, L is the thickness of the specimen and Δn is the difference between the refractive index for light polarized parallel to the slow and fast axes i.e. the birefringence. ΔnL is known as the "optical retardation".

ΔnL is a property of a particular sample of a material (since it is dependent on the thickness of the sample). Δn is a property of the material (since it is independent of the thickness of the sample). Thus from the |sin δ| data, ΔnL for the sample, and hence Δn for the material, can be deduced.

For example, for retardation in first order, with L=0.6 mm and λ=589.6 nm, then:
when sin δ=1 and ΔnL=λ/4, it can be deduced that Δn=2.45×10⁻⁴.
when sin δ=0.5 and ΔnL=λ/12, it can be deduced that Δn=0.819×10⁻⁴.

Since the single crystal diamond material of the present invention is a bulk material rather than a film of infinitesimal thickness, the value of Δn obtained from a given point on a sample is in reality the average of all the instantaneous values of Δn along the relevant optical path through the sample. To emphasise this distinction, Δn may be referred to as $Δn_{[average]}$. It should be made clear that $Δn_{[average]}$ is not an average value for an area perpendicular to the optical path.

The RLP-S-CA method as used in "Metripol" can produce a map showing the spatial variation of |sin δ|, and hence ΔnL, over a sample. If the thickness of the sample is known, Δn at any point can be deduced. The |sin δ| map has a pixel size that is greater than about 10 μm×10 μm and less than about 100 μm×100 μm.

Samples for birefringence measurement are prepared by polishing a pair of parallel surfaces on to a sample and then measuring its thickness. The polished surfaces are preferably parallel to {100} surfaces of the as-synthesised diamond. The sample to be measured is placed in an RLP-S-CA birefringence measurement system and analysed over an area of at least about 1 mm², and preferably at least about 4 mm², and more preferably at least about 12 mm². This may require the analysis of multiple fields. From |sin δ| maps produced by the RLP-S-CA method as used in "Metripol", the maximum value of |sin δ| over the whole of the analysis area is recorded.

Instrument resolution and noise set a lower limit to the value of |sin δ| and hence the minimum optical retardation ΔnL that can be measured, for example by "Metripol". This in turn sets a lower limit on the measurable birefringence, although the limit on this parameter also depends on the specimen thickness. For illustration, if the lower limit on |sin δ| is 0.03, for light of wavelength 550 nm, this corresponds to a lower limit on the measurable birefringence of Δn=5.25×10⁻⁶ for a sample of thickness 500 microns; or a lower limit on the measurable birefringence of Δn=7.5×10⁻⁷ for a sample of thickness 3500 microns. Thus it is possible that a thin sample of a material with a given Δn will have a |sin δ| value that is below the resolution limit that is currently possible, but a thicker sample would be measurable.

Thus, the material of the present invention has a maximum birefringence, Δn, such that:
Δn<1×10 over areas greater than about 1 mm×1 mm, but more preferably over areas greater than about 2 mm×1 mm, or more preferably over areas greater than about 3 mm×1 mm, or even more preferably over areas greater than about 5 mm×2 mm or most preferably over areas greater than about 8 mm×2 mm.
preferably Δn<5×10⁻⁵ over areas greater than about 1 mm×1 mm, but more preferably over areas greater than about 2 mm×1 mm, or more preferably over areas greater than about 3 mm×1 mm, or even more preferably over areas greater than about 5 mm×2 mm or most preferably over areas greater than about 8 mm×2 mm.

Alternatively, the material of the present invention has a maximum birefringence, Δn, such that:
Δn<1×10⁻⁴ over an area greater than about 50%, preferably greater than about 60%, preferably greater than about 70%, preferably greater than about 75%, of the area of growth major {100} surface of the as-synthesised diamond.
preferably Δn<5×10⁻⁵ over an area greater than about 50%, preferably greater than about 60%, preferably greater than about 70%, preferably greater than about 75%, of the area of growth major {100} surface of the as-synthesised diamond.

As described above, an advantage of the synthetic single crystal diamond material of the present invention is that it has an as-synthesized size and shape which means that it is suitable for direct use in a number of applications without requiring further processing. Alternatively, if necessary for the application for which it is intended to be used, the single crystal diamond material of the present invention may be cut or sawn into plates.

As the single crystal diamond material of the present invention has a single dimension which is longer than the other two dimensions, if it is to be cut, it is generally cut in a direction parallel to the longest dimension. Where the diamond is to be cut, methods known in the art may be used. For example, by use of a conventional diamond sawyers' blade (a phosphor-bronze disc impregnated with fine diamond particles) and by means of a laser sawing system typically employing a Nd:YAG laser operating at a wavelength of 1.06 μm. Typically an as-grown stone will be sawn to remove the seed face (that is sawn parallel and close to the growth surface of the seed).

In one embodiment, the present invention provides synthetic single crystal diamond material having an as-synthesized aspect ratio of at least 1.5, preferably at least about 2, preferably at least about 2.5, preferably at least about 3, preferably at least about 4, preferably at least about 5, preferably at least about 10 on any surface $S^#$, wherein the aspect ratio of the as-synthesized diamond crystal is defined as $A^#/B^#$ wherein $A^#$ and $B^#$ define a notional surface $S^#$ in the single crystal diamond material substantially parallel to either the {100} or the {110} plane which is substantially parallel to the seed face of the as-synthesised single crystal diamond material and $A^#$ is the longest dimension of the as-synthesized single crystal diamond material within the surface $S^#$ substantially aligned along a <100> or <110> direction, and $B^#$ is the longest dimension of the as-synthesized single crystal diamond material orthogonal to $A^#$ within the surface $S^#$, substantially aligned along a <100> or <110> direction, and where the notional surface $S^#$ may be a real external surface or a conceptual internal surface;
the longest dimension $a^#$ of the as-synthesised single crystal diamond material, substantially aligned along a <100> or <110> direction and substantially parallel to the surface $S^#$, is at least 6 mm, preferably at least about 7 mm, preferably at least about 8 mm, preferably at least about 9 mm, preferably at least about 10 mm, preferably at least about 11 mm, preferably at least about 12 mm;
the longest dimension $a^#$ contains at least about 3 mm, preferably at least about 4 mm, preferably at least about 5 mm, preferably at least about 6 mm, preferably at least about 8 mm of a single growth sector; and wherein the synthetic single crystal diamond comprises single substitutional nitrogen in a concentration of at least 5 ppm.

Advantageously, the present invention further provides a method for producing a single crystal diamond product wherein the synthetic single crystal diamond material of the present invention is cut in a direction parallel to the longest dimension to produce a single crystal diamond product which contains at least about 50%, preferably at least about 60%, preferably at least about 70%, of the as-synthesised synthetic single crystal diamond material.

In a further aspect, the present invention provides a synthesized single crystal diamond product cut from synthetic single crystal diamond material as defined herein.

The lower density and smaller size of inclusions in the synthetic single crystal diamond material of the invention as compared with prior art material of similar size prepared using a seed with an aspect ratio close to one means there are few problems encountered during sawing. During laser sawing, the beam encountering a metallic inclusion can result in the stone being sawn cracking or, even worse, shattering. During the conventional mechanical sawing, the consequences tend not to be so severe, but encountering an inclusion can result in blade damage, deviation of the cut line and possibly damage to the stone. Thus the material of the invention can be made into pieces suitable for use as cutting tools As a final step, where the synthetic single crystal diamond material of the present invention has been cut or sawn, the sawn plates may be examined using an ultraviolet fluorescence microscope, such as a DiamondView™ instrument, for the existence of well defined growth sectors, including the preferred sector that has been grown from the selected seed growth surface.

The synthetic single crystal diamond material of the present invention is particularly suitable for use in machining applications where a single long cutting edge is required to achieve the necessary workpiece surface finish, such machining liquid crystal display screens, machining precious metal components (jewellery, "objets d'art", etc), optical components such as mirrors and beam splitters.

In this regard, in a further aspect the present invention provides a cutting tool comprising synthetic single crystal diamond material as defined herein.

The synthetic single crystal diamond material of the present invention may also advantageously be used as a substrate for the synthesis of homoepitaxial diamond by chemical vapour deposition processes.

The present invention is hereinafter described by reference to the following figures and examples which are in no way intended to limit the scope of protection claimed.

FIGS. 1(a) to (f) illustrate different arrangements of seeds mounted onto a substrate;

Figure 1A:
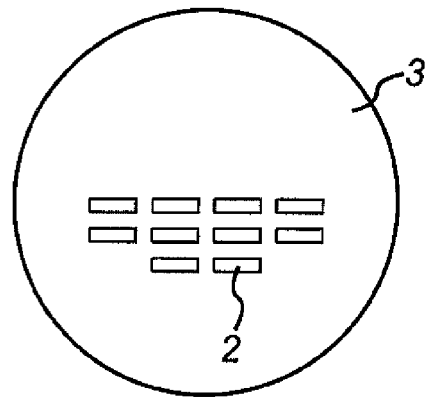

As described above, FIGS. 1(a) to (f) illustrate different arrangements of seeds (2) on a substrate (3). In all of these examples, the substrate (the "seed pad") is approximately cylindrical with the seeds arranged on one of the two planar surfaces. In these examples, the seeds are tessellated (with appropriate spaces between seeds and rows of seeds) to cover essentially the entire surface of the substrate. In FIG. 1(a) the seeds are arranged in rows wherein the seeds in a given row are aligned with seeds in adjacent rows.

Figure 1B:
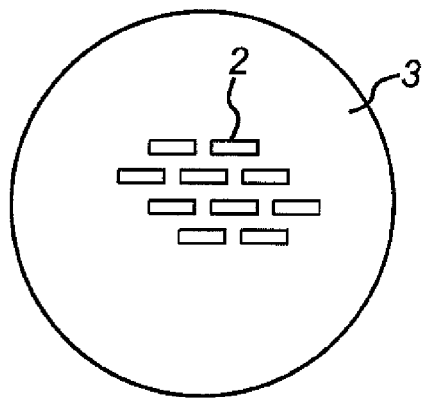

In FIG. 1(b), the seeds are arranged in rows wherein the seeds in a row are offset in position with respect to the seeds in adjacent rows.

Figure 1C:
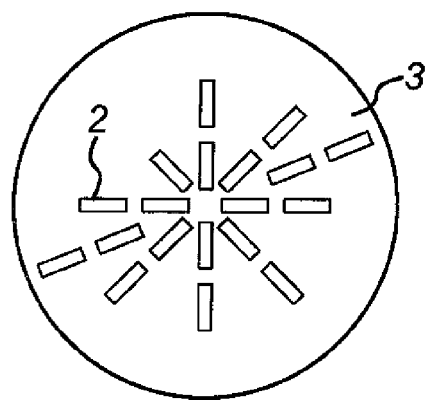

In FIG. 1(c), the seeds are arranged so as to extend out radially from a central point on the substrate.

Figure 1D:
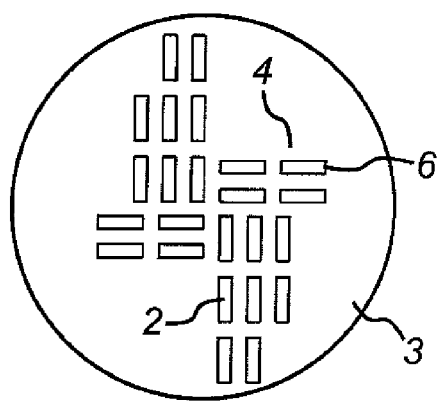

In FIG. 1(d), the seeds are arranged on the substrate (3) in four separate blocks (4). In a block, the seeds are arranged in rows (6) wherein the seeds in a given row within a block are aligned with the seeds in adjacent rows in the block. All of the seeds in a given block are positioned at 90° to the seeds in an adjacent block.

Figure 1E:
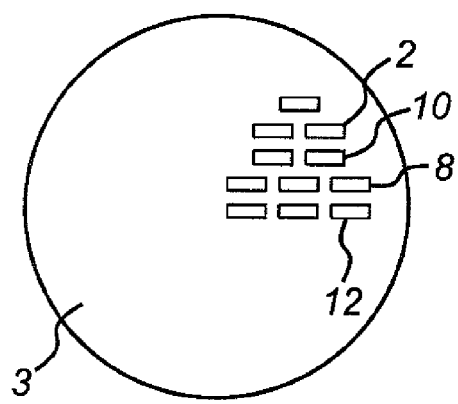

In FIG. 1(e), the seeds (2) are arranged in rows on the substrate (3). Each row of seeds is adjacent to two other rows of seeds. The arrangement is such that the seeds in any given row (8) are aligned with the seeds in one adjacent row (12) and arranged offset in relation to the seeds in the other row (10).

Figure 1F:
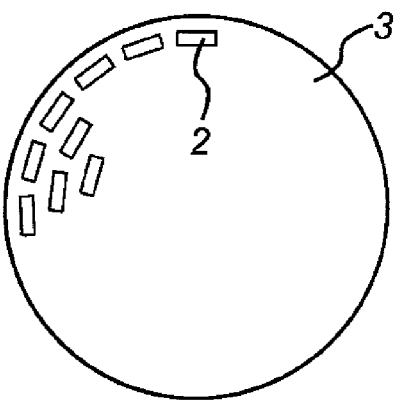

In FIG. 1(f), the seeds (2) are arranged circumferentially around the circular substrate (3).

Figure 2A:
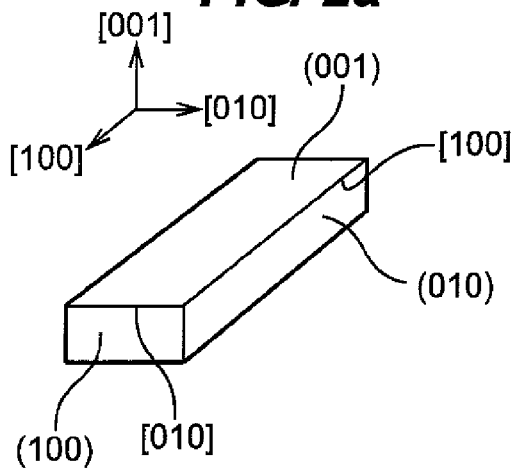
FIG. 2(a) is a schematic representation of a seed showing typical facets observed.

FIG. 2(a) is a schematic representation of a seed according to the present invention which has a (001) growth surface. This figure is included for the purpose of clarifying the different facets which are observed.

Figure 2B:
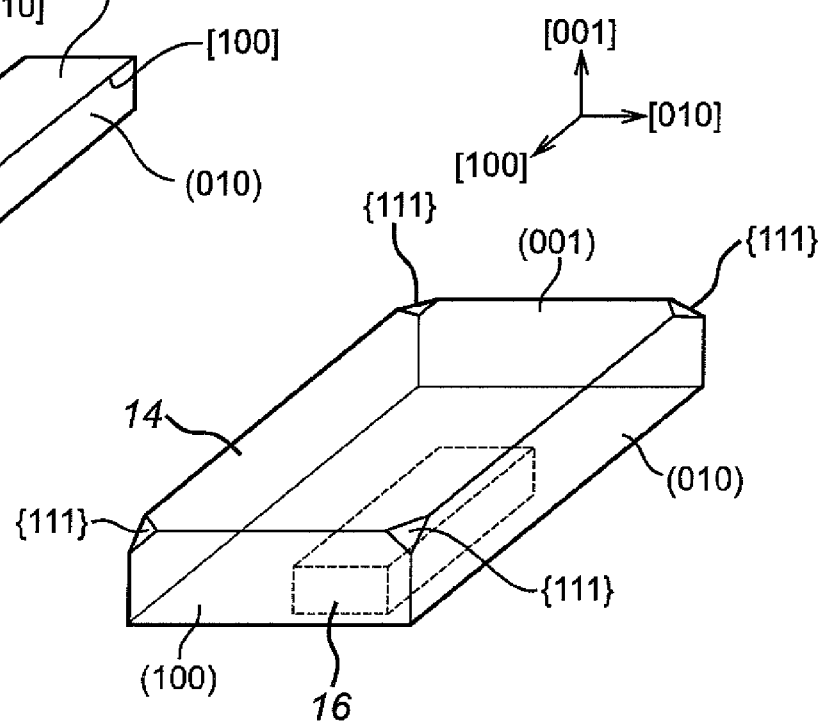
FIG. 2(b) is a schematic representation of a synthesized crystal on a seed showing the typical facets observed.

FIG. 2(b) is a schematic representation of single crystal diamond material (14) grown on a seed (16) according to the present invention. The seed has a (100) growth surface and the synthesized single crystal diamond material shows dominant (001) major faces, {100} side faces and minor {111} faces on the corners.

Figure 2C:
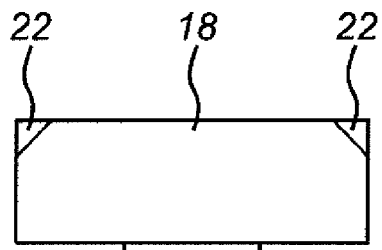
FIG. 2(c) is a schematic representation of a cross-section through the short side of a synthesized crystal on a seed showing the typical facets observed.

FIG. 2(c) is a schematic representation of an end view of the short side, specifically the side with smallest surface area, of a synthesized crystal (18) on a seed (20). The {111} corner facets (22) can clearly be seen.

Figure 2D:
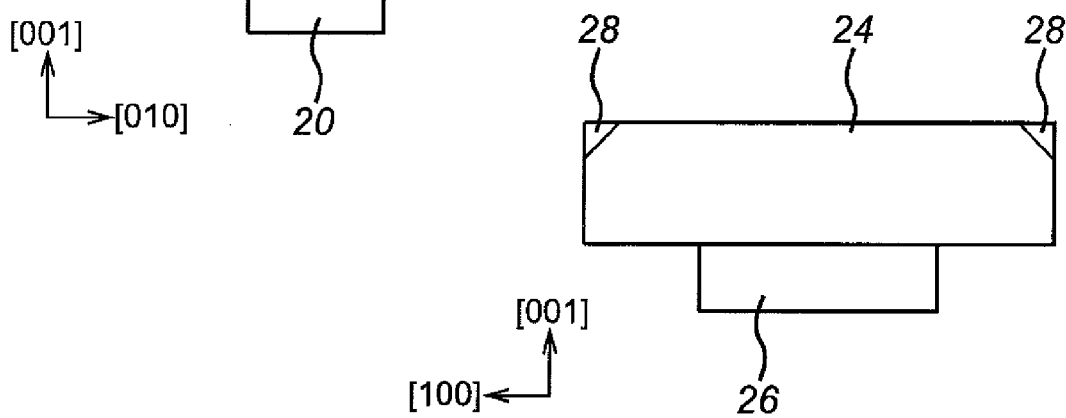
FIG. 2(d) is a schematic representation of a cross-section through the long side of a synthesized crystal on a seed showing the typical facets observed.

FIG. 2(d) is a schematic representation of an end view of the long side, specifically the side with largest surface area, of a synthesized crystal (24) on a seed (26). The {111} corner facets (28) can clearly be seen.

Figure 3A:
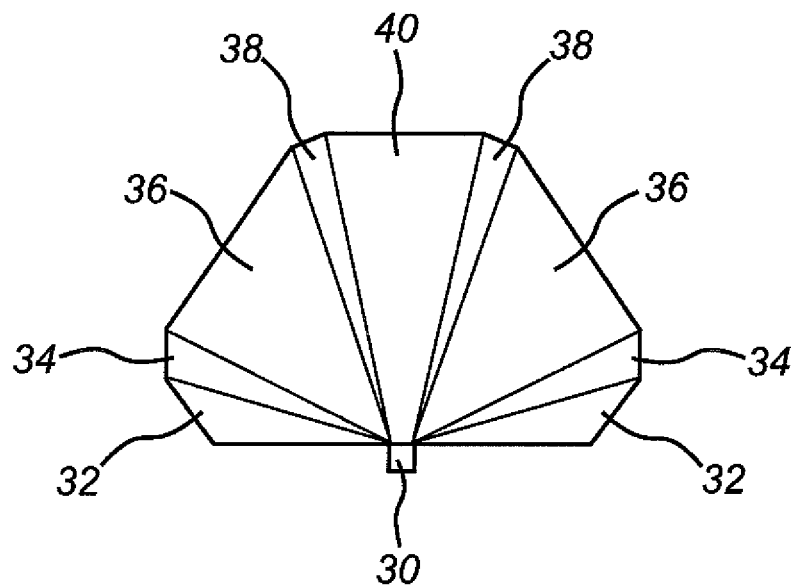
FIG. 3(a) is an illustration of the growth sectors observed in a vertical section through a synthetic diamond crystal grown on a small seed with a (001) growth surface.

FIG. 3(a) is a schematic view of a vertical section through a synthetic crystal diamond grown on a seed (30) having a (001) growth surface with an aspect ratio of less than 1.5. A number of different growth sectors can be seen, specifically, the {111} growth sector (32), the {100} growth sector (34), the {111} growth sector (36), the {113} growth sector (38) and the (001) growth sector (40).

Figure 3B:
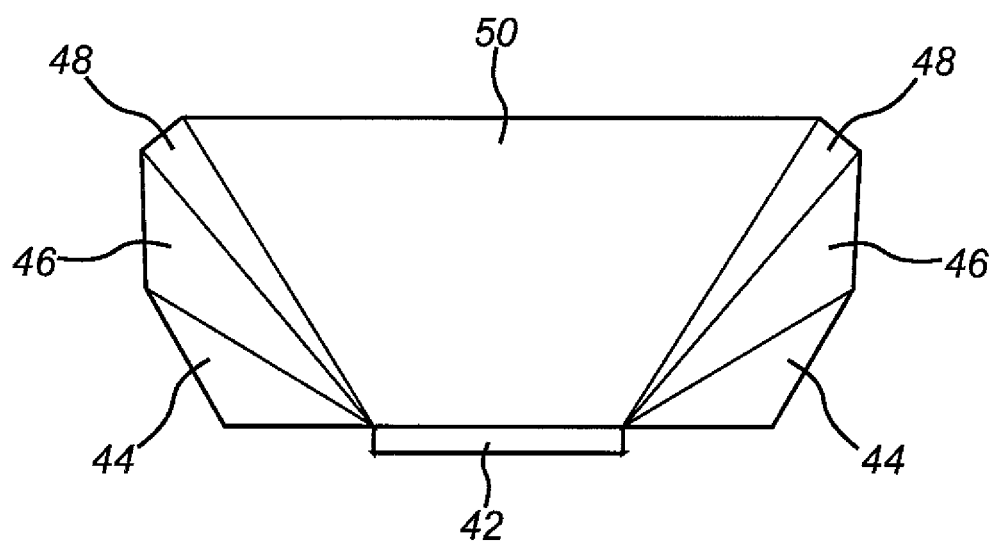
FIG. 3(b) is an illustration of the growth sectors observed in a vertical section through a synthetic diamond crystal grown on a seed according to the present invention having a (001) growth surface.

FIG. 3(b) is a vertical section through a synthetic crystal diamond grown on a seed (42) having a (001) growth surface with an aspect ratio of greater than 1.5. A number of different growth sectors can be seen, specifically, the {111} growth sector (44, 48), the {110} growth sector (46), and the (001) growth sector (50). It can be seen that where a seed according to the present invention is used, specifically a seed having a growth surface with an aspect ratio of greater than 1.5, the (001) growth sector forms a much larger proportion of the volume of the as-synthesized single crystal diamond material as compared to the single crystal diamond material obtained where a seed which does not fulfil this criteria is used, where the single crystal diamond material is grown to the same height above the growth surface of the seed in each case.

Figure 4:
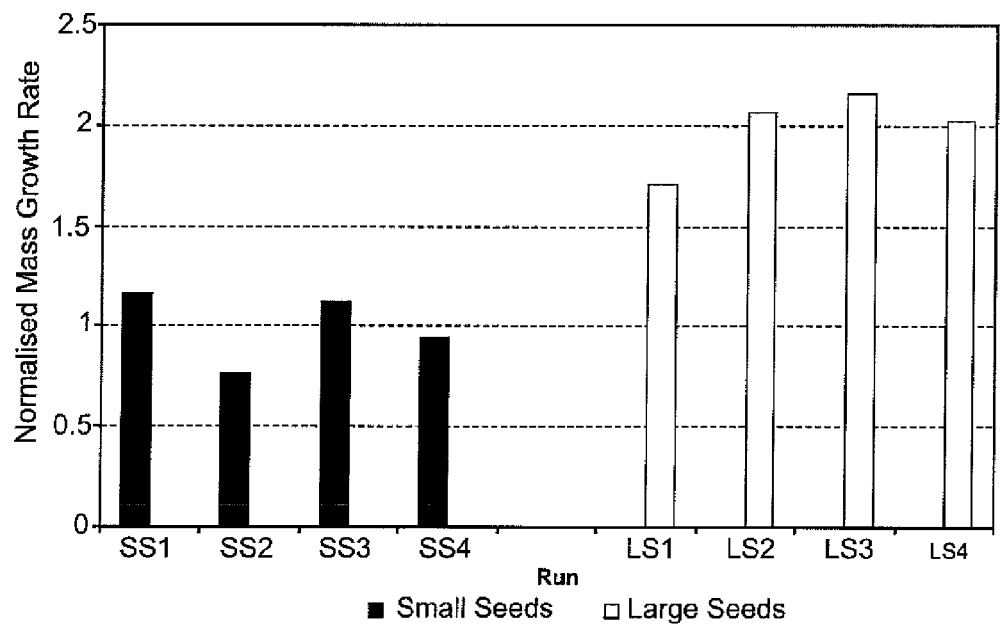
FIG. 4 is a graph showing the normalised growth rate from small and large seeds under the same process conditions and run time.

FIG. 4 is a graph showing the normalised growth rate in mg/hr from HPHT single crystal diamond growth on a seed having a growth surface with an aspect ratio of less than 1.5 ("small seed" synthesis runs) and a seed having a growth surface with an aspect ratio of greater than 1.5 ("large seed" synthesis runs), respectively. The growth rates have been normalised against the average of the four "small seed" runs. The synthetic single crystal diamond material in each case was prepared under the same conditions and single crystal growth was effected for the same period of time. It can be seen that, where a seed according to the present invention was used, for a given period of single crystal growth, a synthesized single crystal diamond with larger dimension is obtained as compared to the products obtained by use of seeds with a growth surface having an aspect ratio of less than 1.5. On average the products obtained by use of seeds with a growth surface having an aspect ratio of greater than 1.5 were 98% larger than those obtained using seeds with a growth surface having an aspect ratio of less than 1.5.

Figure 5A:
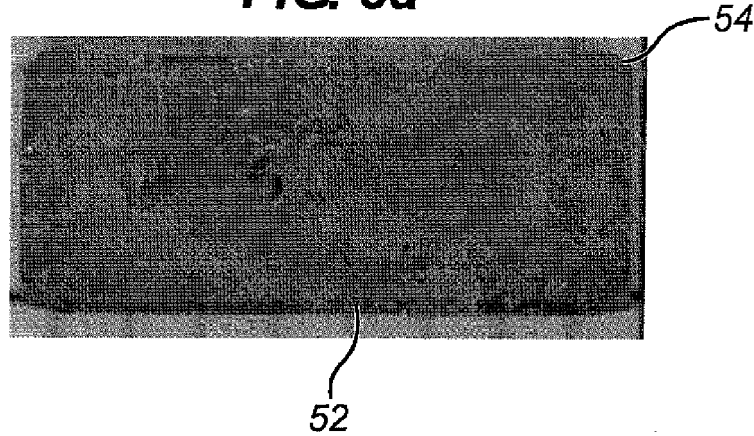
FIG. 5 is a photograph of an as-synthesized single crystal diamond material of the present invention.

FIG. 5a is an optical micrograph of an as synthesised diamond according to the method of the invention. The dimensions of the stone are 8.20 mm×3.50 mm×1.92 mm. The top surface (52) is the (001) surface and the sides surfaces are {100} surfaces. Four {111} facets (54) are visible on the corners of the stone. No other facets of any significance are visible.

Figure 5B:
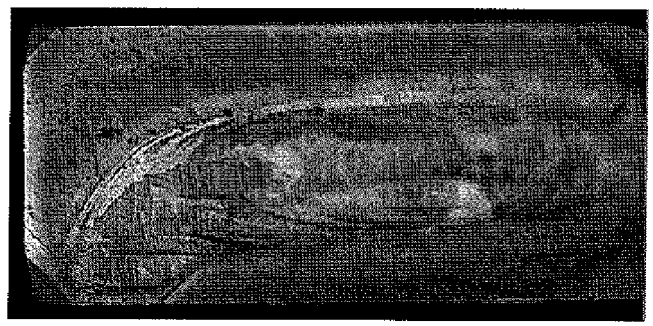

FIG. 5b is a photoluminescence image of an as synthesised diamond according to the method of the invention. The image was obtained using an ultraviolet imaging system, for example a DiamondView™ instrument. The luminescence (which gives the diamond a green colour) is associated with the H3 nitrogen-vacancy defect.

Figure 6:
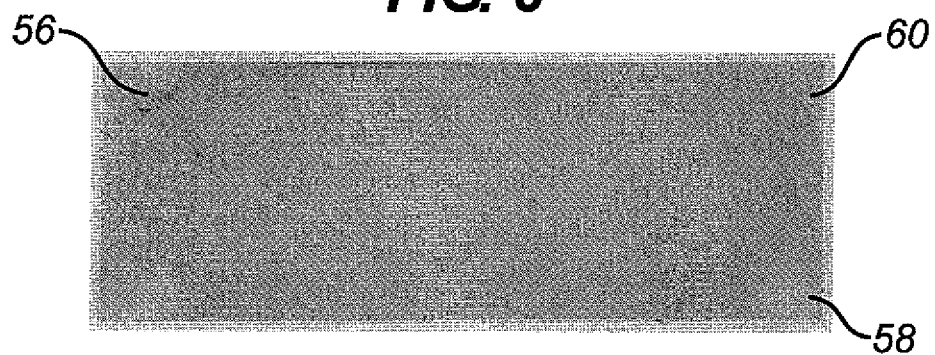
FIG. 6 is a transmission optical micrograph of a single crystal diamond plate processed from synthetic single crystal diamond material of the present invention.

FIG. 6 is a transmission optical micrograph of a plate of single crystal diamond material (58) according to the present invention. The small dark regions (56) towards the upper left of the plate are metallic inclusions incorporated during synthesis. The plate has dimensions 7.86×2.78×0.44 mm. The plate is a uniform yellow colour apart form {111} growth sectors at the corners (60).

Figure 7:
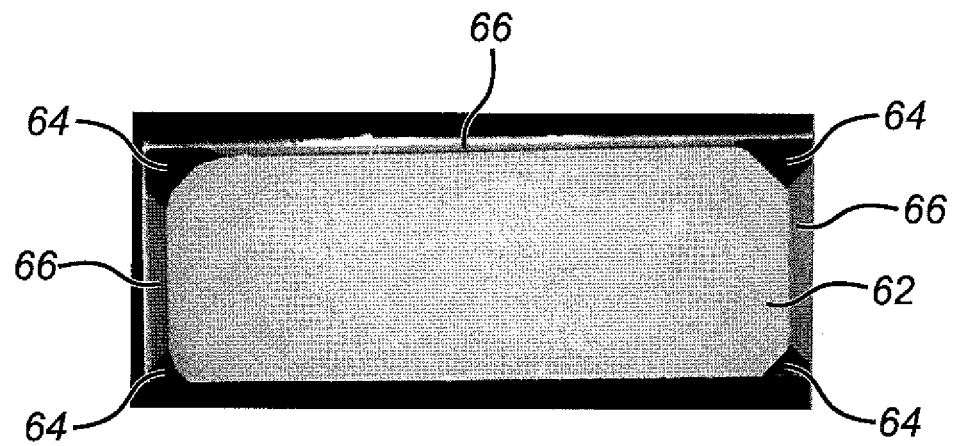
FIG. 7 is a photoluminescence image of synthetic single crystal diamond material according to the present invention, obtained using a UV imaging system (e.g. DiamondView™)

FIG. 7 is a photoluminescence image of the same plate as in FIG. 6 obtained using an ultraviolet imaging system, for example a DiamondView™ instrument. The variation in colouration is due to different intensities of green luminescence from H3 defects (H3 is a nitrogen-related defect) in different growth sectors. The image shows that the majority of the stone is comprised of a single large (001) growth sector (62) (light grey on the image), with smaller, roughly triangular {111} growth sectors (64) at the corners (black on the image) and minor growth sectors (probably {110} or {113}) (66) along the edges (dark grey on the image).

Figure 8:
FIG. 8 is an optical micrograph obtained using cross-polars of synthetic single crystal diamond material of the present invention.

FIG. 8 is an optical micrograph of the same plates as FIG. 6 obtained using crossed-polars showing the pattern of strain in synthetic single crystal diamond material of the present invention. The brightness of the image is related to the level of birefringence and hence the level of strain in the material: dark (black) areas are those with no or very low strain, grey areas low strain, white areas have the highest strain. The image shows that the highest strain is associated with the boundaries between the central (001) growth sector and corner {111} growth sectors.

Figure 9:
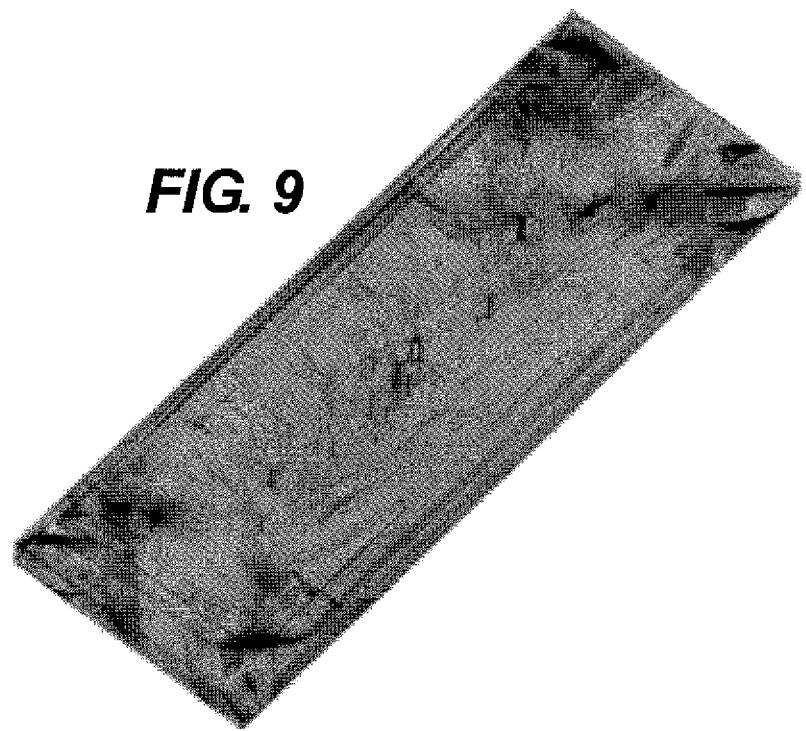
FIG. 9 is an X-ray projection topograph of a plate of synthetic single crystal diamond material according to the present invention.

FIG. 9 is an X-ray projection topograph of a plate of synthetic single crystal diamond material of the present invention (the same plate as FIG. 6). The dark lines are traces related to extended defects (dislocations, dislocation bundles and stacking faults). The central (001) growth sector has a much lower density of extended defects than the corner {111} growth sectors.

Figure 10A:
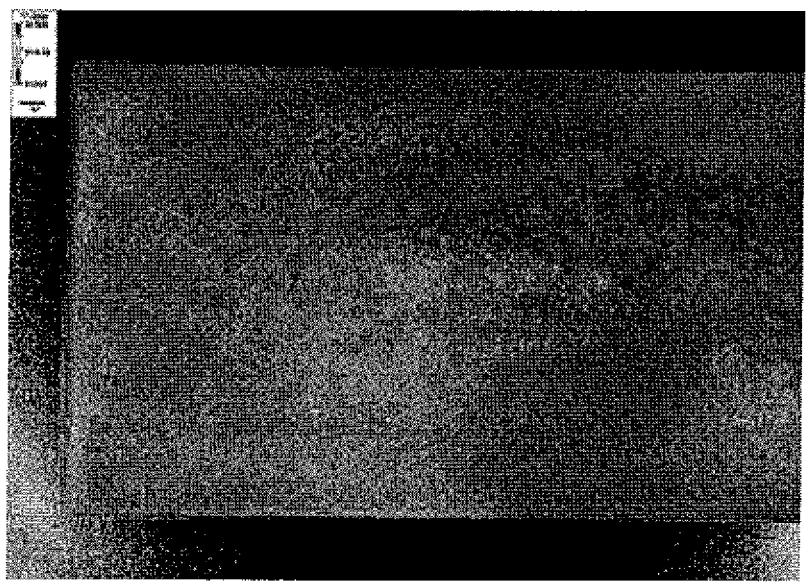
FIGS. 10(a) and (b) are greyscale maps of the birefringence of a 535 μm thick plate of synthetic single crystal diamond material of the present invention.
Figure 10B:
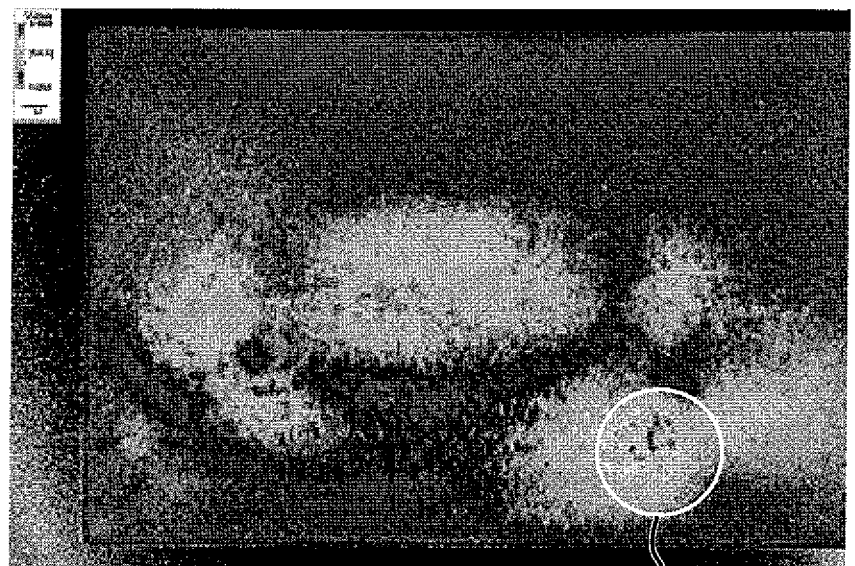

FIGS. 10(a) and (b) are greyscale maps of the birefringence of 535 μm thick plates of synthetic single crystal diamond material of the present invention. The maps were obtained using a "Metripol" birefringence measurement system. The birefringence is measured through the thickness of the plate. Maximum birefringence in FIG. 10(a) is approximately $2\times10^{-5}$ and the typical birefringence is about $1\times10^{-5}$. Maximum birefringence in FIG. 10(b) is about $5\times10^{-5}$ (the dark areas within circle 68) and the typical birefringence is less than $2\times10^{-5}$.

EXAMPLES

It will be understood by those skilled in the art that the exact details of how the material of the invention was made are highly specific to the exact high pressure-high temperature apparatus used, for example the amount of excess graphite that is required or the quantity of solvent catalyst metal required.

Example 1

A set of 40 seeds made from HPHT diamonds were selected. The seeds had a polished top (growth) surface ($R_a$ measured with a stylus profilometer of less than 100 nm) and were laser cut using a Nd:YAG laser from larger plates. The seeds have dimensions 5.0 mm×0.58 mm×0.58 mm. The seed geometry was such that the growth surface was within 10° of the (001) and the edges of the seeds were within 10° of <100> directions.

The seeds were selected according to the following criteria:
Inclusion Content (no inclusions greater than 0.2 mm in size and on average less than 1 inclusion per linear mm of the maximum edge length)
Absence of cracking (as viewed at 10×)
Surface finish ($R_a$<80 nm)
>60% single sector growth habit
Dimensional tolerance—all dimensions within 0.1 mm of the required size.

The seeds were arranged on a seedpad using a layout as in FIG. 1a with a separation between seeds of 5.75 mm and a separation between rows of approximately 4.75 mm.

The seedpad loaded with seeds was assembled into an HPHT press capsule together with an nickel-iron alloy solvent catalyst metal (70 wt. % Ni, 30 wt. % Fe) and sufficient high purity graphite powder to supply the required carbon for the growth process.

The assembled capsule was loaded into a HPHT press and ramped to a synthesis pressure of 5.5 GPa and a temperature of 1400° C. Ramping the pressure too quickly can result in the seeds being damaged (e.g. cracking into two or more pieces), whilst ramping the temperature too quickly can result in the seeds being exposed to a high temperature in the absence of a stabilising pressure and resulting in complete graphitisation of the seed. Once the capsule is at the growth temperature, the pressure is maintained, the rams moving to maintain the pressure as the graphite is converted to diamond The contents of the capsule were maintained at temperature and pressure for the duration of the synthesis run. On completion of the synthesis run, the pressure and temperature were slowly ramped down in such a manner as to avoid destroying the as-synthesised stones. The stones were recovered from the solvent catalyst metal by dissolving the metal in aqua regia (concentrated nitric acid and concentrated hydrochloric acid, in a volumetric ratio of 1:3) at a temperature of 60 to 70° C.

During recovery the seed typically break away from the bottom of the synthesised diamond, or if not can be removed by simple mechanical means.

The results of the synthesis are shown Table 1 together with results from comparative process 1 (using standard seeds, approximately 0.45×0.45×0.45 mm in size) and comparative process 2 (using larger equiaxed seeds about 2×2×1 mm in size). The process of the current invention yielded diamonds, such as such shown in FIG. 5, with typical dimensions of about 8.2×3.5×1.9 mm. The diamonds produced by the comparative processes 1 and 2 were approximately equiaxed with substantially smaller largest dimensions. As the synthesis runs were all of the same duration, the relative synthesis durations that would be required to produce diamonds with a longest dimension greater than 8 mm can be calculated and these were found to be 2.14 for comparative process 1 and 1.7 for comparative process 2.

TABLE 1

|  | Comparative process 1 | Comparative Process 2 | Process of the current invention |
|---|---|---|---|
| Seed Size, mm | 0.45 × 0.45 × 0.45 | 2 × 2 × 1.0 | 5. × 0.58 × 0.58 |
| Average as-synthesised diamond mass, mg | 89–120 | 182–204 | 221 |
| Relative run time to reach 8 mm maximum dimension, hrs | 2.14 | 1.7 | 1 |

Example 2

A set of 59 seeds made from HPHT diamonds were selected. The seeds had a polished top (growth) surface ($R_a$ measured with a stylus profilometer of less than 100 nm) and were laser cut using a Nd:YAG laser from larger plates. The seeds had dimensions 3.5 mm×1.0 mm×1.0 mm. The seed geometry was such that the growth surface was within 10° of the (001) and the edges of the seeds were within 10° of <100> directions.

The seeds were selected according to the following criteria:
Inclusion content (no inclusions greater than 0.2 mm in size and on average less than 1 inclusion per linear mm of the maximum edge length)
Absence of cracking (as viewed at 10× magnification)
Surface finish ($R_a$<80 nm)
>60% single sector growth habit
Dimensional tolerance—all dimensions within 0.1 mm of the required size.

The seeds were arranged on a seed pad using a layout as in FIG. 1a with a separation between seeds of approximately 5.75 mm and a separation between rows of approximately 4.75 mm.

The seed pad was assembled into a capsule as described in example 1. The process conditions and process duration were approximately the same as those used for example 1.

The stones were recovered from the synthesis capsule at the end of the synthesis run as described in example 1. During recovery the seeds typically break away from the bottom of the synthesised diamond, or if not can be removed by simple mechanical means.

59 stones were recovered from the synthesis run. The recovered stones had a size range from 5.5 mm×3.0×1.8 mm to 8.5×5.0×2.3 mm. The stones were sorted by the length of their longest edge parallel to <100>, with categories of:
≥5.5 mm, <6.0 mm,
≥6.0 mm, <6.5 mm,
≥6.5 mm, <7.0 mm,
≥7.0 mm, <7.5 mm,
≥7.5 mm, <8.0 mm,
≥8.0 mm, <8.5 mm,
≥8.5 mm, <9.0 mm.

The peak of the edge length distribution was for the category ≥7.0 mm, <7.5 mm. The typical as-grown stone dimensions were 7.0 mm×4.3 mm×1.8 mm. All the as-grown stones had an aspect ratio (that is, length÷breadth) of >1.5.

Example 3

A set of 34 seeds made from HPHT diamonds were selected. The seeds had a polished top (growth) surface ($R_a$ measured with a stylus profilometer of less than 100 nm) and were laser cut using a Nd:YAG laser from larger plates. The seeds had dimensions of 7.0 mm×1.0 mm×1.0 mm. The seed geometry was such that the growth surface was within 10° of the (001) and the edges of the seeds were within 10° of <100> directions.

The seeds were selected according to the following criteria:
Inclusion content (no inclusions greater than 0.2 mm in size and on average less than 1 inclusion per linear mm of the maximum edge length)
Absence of cracking (as viewed at 10× magnifcation)
Surface finish ($R_a$<80 nm)
>60% single sector growth habit
Dimensional tolerance—all dimensions within 0.1 mm of the required size.

The seeds were arranged on a seed pad using a layout as in FIG. 1a with a separation between seeds of approximately 5.75 mm and a separation between rows of approximately 4.75 mm.

The seed pad was assembled into a capsule as described in example 1. The process conditions and process duration was approximately the same as that used for example 1.

The stones were recovered from the synthesis capsule at the end of the synthesis run as described in example 1. During recovery the seeds typically break away from the bottom of the synthesised diamond, or if not can be removed by simple mechanical means.

34 stones were recovered from the synthesis run. The recovered stones had a size distribution of 9.5 mm×3.5 mm×1.8 mm to 12.0 mm×4.8 mm×2.2 mm. The stones were sorted by the length of their longest edge parallel to <100>, with categories of:
≥9.0 mm, <9.5 mm,
≥9.5 mm, <10.0 mm,
≥10.0 mm, <10.5 mm,
≥10.5 mm, <11.0 mm,
≥11.0 mm, <11.5 mm,
≥11.5 mm, <12.0 mm,
≥12.0 mm, <12.5 mm.

The peak of the edge length distribution was for the category ≥11.0 mm, <11.5 mm. The typical as-grown stone dimensions were 11.0 mm×4.5 mm×2.0 mm. All the as-grown stones had an aspect ratio (that is, length÷breadth) of >2.0.

The invention claimed is:

1. A method for synthesizing single crystal diamond comprising:
   (a) selecting a single crystal diamond seed having a growth surface with two orthogonal dimensions a* and b*, where a* is the longest dimension of the growth surface substantially aligned along a <100> or <110> direction in the plane of the growth surface, and b* is the longest dimension of the growth surface in a direction orthogonal to a* lying in the plane of the growth surface, where the aspect ratio of the growth surface which is defined as a*/b* is at least 1.5;
   (b) mounting the seed on or into a surface of a substrate such that the growth surface of the seed is exposed and the growth surface of the seed is substantially parallel to the surface of the substrate; and
   (c) effecting crystal growth in a high pressure high temperature environment under conditions such that a single crystal diamond is produced on at least the growth surface of the seed;
   wherein the synthesized single crystal diamond has a longest dimension $a^\#$ aligned along a <100> or <110> direction, which exceeds at least 6 mm,
   wherein the synthesized single crystal diamond has an as-synthesized aspect ratio of at least 1.5 on a notional surface $S^\#$, and
   wherein the aspect ratio of the as-synthesized diamond crystal is defined as $A^\#/B^\#$ wherein $A^\#$ and $B^\#$ define the notional surface $S^\#$ in the single crystal diamond material substantially parallel to either the {100} or the {110} plane which is substantially parallel to the seed face of the as-synthesized single crystal diamond material, $A^\#$ is the longest dimension of the as-synthesized single crystal diamond material within the surface $S^\#$ substantially aligned along a <100> or <110> direction, and $B^\#$ is the longest dimension of the as-synthesized single crystal diamond material orthogonal to $A^\#$ within the surface $S^\#$, substantially aligned along a <100> or <110> direction, and the longest dimension $a^\#$ of the as-synthesized single crystal diamond material is substantially parallel to the surface $S^\#$.

2. The method of claim 1, wherein the growth surface of the single crystal diamond seed has a dimension, a*, of at least 3 mm.

3. The method of claim 1, wherein the growth surface of the single crystal diamond seed has a dimension, b*, of less than 2 mm.

4. The method according to claim 1, wherein the diamond seed selected is such that at least about 30% of the growth surface of the seed is a single growth sector.

* * * * *